(12) United States Patent
Fujimaki

(10) Patent No.: US 6,548,371 B2
(45) Date of Patent: *Apr. 15, 2003

(54) METHOD OF FORMING A GROOVE-LIKE AREA IN A SEMICONDUCTOR DEVICE

(75) Inventor: Hirokazu Fujimaki, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/283,180

(22) Filed: Apr. 1, 1999

(65) Prior Publication Data

US 2002/0076898 A1 Jun. 20, 2002

(30) Foreign Application Priority Data

Nov. 25, 1998 (JP) ............................................. 10-334021

(51) Int. Cl.[7] .............................................. H01L 21/76
(52) U.S. Cl. ...................................... 438/424; 438/524
(58) Field of Search .................... 438/700, 704–706, 438/713, 714, 430, 431, 444, 391, 978, 221, 296; 216/72, 79

(56) References Cited

U.S. PATENT DOCUMENTS

| 4,456,501 A | * | 6/1984 | Bayman et al. ............... 156/643 |
| 4,688,069 A | * | 8/1987 | Joy et al. ...................... 357/34 |
| 5,128,743 A | * | 7/1992 | Tamaki et al. ................. 357/50 |
| 5,223,085 A | * | 6/1993 | Kawai et al. .................. 156/646 |
| 5,422,299 A | * | 6/1995 | Neudeck et al. .............. 438/424 |
| 5,851,928 A | * | 12/1998 | Cripe et al. .................. 438/748 |
| 5,858,859 A | * | 1/1999 | Miyashita et al. ........... 438/426 |
| 5,888,906 A | * | 3/1999 | Sandhu et al. ............... 438/706 |

FOREIGN PATENT DOCUMENTS

| JP | 58-009333 | 1/1983 |
| JP | 58-031531 | 2/1983 |

OTHER PUBLICATIONS

C.P. Chang et al., "A Highly Manufacturable Corner Rounding Solution for 0.18 um Shallow Trench Isolation," 1997 IEEE (4 pages).

* cited by examiner

Primary Examiner—David Nelms
Assistant Examiner—David Nhu
(74) Attorney, Agent, or Firm—Volentine Francos, PLLC

(57) ABSTRACT

A method for manufacturing a semiconductor device in which one active area and another active area formed on an element substrate are electrically isolated from each other includes a first step in which a groove-like area is formed at the element substrate by performing a treatment under conditions whereby the etching rate on a surface {100} is higher than the etching rate on a surface {111} in the area between the one active area and the another active area, and a second step in which the bottom surface of the groove-like area is etched through anisotropic etching. The first step is implemented within a 20 Torr hydrogen gas atmosphere that contains hydrogen chloride gas, and at a temperature of 800 centigrade. The shape of the corner portion formed at the upper end of the trench becomes widened until the angle formed by the side wall and the surface {111} is approximately 144.7 degrees, thereby greatly reducing the concentration of stress at the corner portion. As a result, the shape of the element substrate which is affected by the thermal oxidation is improved to make it possible to reduce the degree to which stress concentrates at the element substrate.

17 Claims, 13 Drawing Sheets

METHOD OF FORMING A GROOVE-LIKE AREA IN A SEMICONDUCTOR DEVICE

BACKGROUND OF THE INVENTION

1. Field of the Invention

The present invention relates to a semiconductor device and a method for manufacturing the semiconductor device, and in particular, it relates to a semiconductor device in which element isolation is achieved by an oxide film and a method for manufacturing the semiconductor device.

2. Description of the Related Art

While the degree to which integration is achieved improves as semiconductor elements become smaller, element isolation must be considered as one of the factors that determine the degree of integration. The element isolation is an essential step performed in the semiconductor manufacturing process, and typical technologies adopted in the element isolation include the LOCOS focal oxidation of silicon) method and the trench method. In the LOCOS method, a thermally oxidized film formed by selectively oxidizing a semiconductor substrate is used as an element isolation area.

The trench isolation structure achieved through the trench method has been in use as a basic isolation structure for more than 10 years in the area of high speed bipolar type LSI devices. In addition, in recent years, STI (shallow trench isolation), which is a type of trench method, has been employed in the CMOS (complimentary metal-oxide semiconductor) logic and memory. STI, which prevents the formation of bird's beak present in the LOCOS structure in the prior art, eliminates superfluous conversion difference. As a result, advantages such as a great improvement in the degree to which elements can be integrated are achieved.

An example of the trench isolation structure in the prior art is now explained in reference to FIG. 9.

First, an exposed front portion of a surface of an element substrate 801 constituted of silicon is thermally oxidized to approximately 3000 angstrom to form a thermally oxidized film 802 as illustrated in FIG. 9(A). Next, a resist pattern is formed through regular photolithography technology and then, by using this resist pattern as a mask, the thermally oxidized film 802 is patterned as illustrated in FIG. 9(B).

Then, after removing the resist pattern, opening portions are anisotropically etched using the thermally oxidized film 802 as a mask to form a trench 801*a* as illustrated in FIG. 9(C). Next, by thermally oxidizing the side walls of the trench 801*a* to approximately 500 angstrom, a thermally oxidized film 803 is formed as illustrated in FIG. 9(D). In the next step, the trench is completely embedded, as illustrated in FIG. 9(E) by depositing a film 804 achieving outstanding coverage, which may be constituted of a low pressure CVD (LFCVD: low pressure chemical-vapor deposition) film over the entire surface of the substrate.

Then, if it is necessary to achieve global planarization due to varying gap intervals, as in the case when STI is adopted, planarization is implemented through CMP (chemical mechanical polishing). If, on the other hand, there are only narrow constant gap intervals present, the oxide film is etched back and flattened through dry etching of the oxide film to complete the isolation process, as illustrated in FIG. 9(F).

Through the process described above, a full-depth trench isolation structure with hardly any conversion difference is formed. As a result, it becomes possible to achieve higher integration in a single layer and to reduce the parasitic capacity of the elements, the wiring capacity and the like, to result in a great advantage in realizing higher speed.

It is to be noted that trench structures such as STI differ from the structure employed in high speed bipolar devices in that the edges of the trenches are formed in extreme proximity to active areas. Because of this, the trench structure and the process for forming the trench greatly affects the characteristics of the active elements. What affects the characteristics of the active elements to the greatest degree is stress attributable to the trench structure and the formation process, and it presents a significant obstacle to the production of elements. The causes of such stress are primarily divided into stress factors attributable to the material characteristics of, mainly, the trench filler material, and stress factors occurring when oxidizing the right angle edges at the upper end of the trench that are seen when viewing the trench from the sectional direction.

The shape of the oxide film resulting from the concentrated stress occurring when thermally oxidizing the vicinity of the edges of a trench is explained in reference to FIG. 10. When the thermally oxidized film 802 is formed by thermally oxidizing the element substrate 801 in which the trench has been formed at 1000 centigrade, the thickness of the oxide film is locally reduced in the vicinity of the edge 802*a* of the trench due to the concentration of stress occurring during the thermal oxidization resulting in the corner of the element substrate becoming even sharper. Such concentration of stress may result in an increase in the leak current of an MOS transistor formed in the vicinity or a crystal defect such as dislocation occurring during a subsequent heat treatment. Since they are caused by the corner of the element substrate being a sharp angle, it is necessary to improve upon its shape.

SUMMARY OF THE INVENTION

An object of the present invention, which has been completed by addressing the problems of the semiconductor devices in the prior art discussed above, is to provide a new and improved semiconductor device in which the shape of the element substrate that is affected by the thermal oxidation is improved to reduce the degree to which stress concentrates at the element substrate and a method for manufacturing this semiconductor device.

In order to achieve the object described above, in a first aspect of the present invention, a semiconductor device adopting a structure in which one active area formed on an element substrate is electrically isolated from another active area, that is characterized in that a groove-like area is formed between the one active area and the other active area with the groove-like area constituted of a side wall extending roughly vertical to the front surface of the element substrate and an inclined surface formed in the vicinity of the upper portion of the side wall at an angle larger than 90 degrees relative to the side wall, is provided.

In order to sent the angle formed by the side wall and the inclined surface larger than 90 degrees, the side wall may be, for instance, a surface {111} of the element substrate.

In this structure, the shape of the corner portion formed at the upper end of the trench is widened so that the angle formed by the side wall and the surface {111} is approximately 144.7 degrees, resulting in a great reduction in the concentration of stress at the corner portion occurring during the thermal oxidation. As a result, a reduction in the leak current is achieved and any crystal defects can be prevented, to achieve a great improvement in yield.

In addition, in a second aspect of the present invention, a method for manufacturing a semiconductor device adopting a structure in which one active area formed on an element substrate is electrically isolated from another active area, that includes a first step in which a groove-like area is formed at the element substrate through a treatment performed on the area between the one active area and the other active area under conditions whereby the etching rate on the surface {100} is higher than the etching rate on the surface {111} and a second step in which the bottom surface of the groove-like area is etched through anisotropic etching, is provided.

It is to be noted that the first step may be implemented under conditions whereby the etching rate on the surface {100} is essentially double or more than double the etching rate on the surface {111}, e.g., within a hydrogen gas atmosphere containing hydrogen chloride gas at a temperature of 800 centigrade or lower.

By adopting this manufacturing method, the semiconductor device achieving outstanding advantages described above can be manufactured with ease.

Furthermore, in a third aspect of the present invention, a method for manufacturing a semiconductor device adopting a structure in which one active area formed on an element substrate is electrically isolated from another active area, that includes a first step in which a groove-like area is formed at the element substrate by performing a treatment on the area between the one active area and the other active area under conditions whereby the etching rate on the surface {100} is essentially the same as the etching rate on the surface {111}, a second step in which etching is performed on the groove-like area under conditions whereby the etching rate on the surface {100} is higher than the etching rate on the surface {111} and a third step in which the bottom surface of the groove-like area is etched through anisotropic etching, is provided.

It is to be noted that the first step may be implemented within a hydrogen gas atmosphere containing hydrogen chloride gas at a temperature of 900 centigrade or higher. In addition, the second step may be implemented under conditions whereby the etching rate on the surface {100} is essentially double or more than double the etching rate on the surface {111}, e.g., within a hydrogen gas atmosphere containing hydrogen chloride gas at a temperature of 800 centigrade or lower.

By adopting this manufacturing method, in which side etching is performed under isotropic etching conditions that achieve side etching with a high degree of efficiency and then a treatment is performed under highly anisotropic conditions, advantages are achieved in that the degree of freedom for controlling the depthwise direction and the side etching quantity increases and in that the length of time required for the treatment is reduced.

Moreover, in a fourth aspect of the present invention, a method for manufacturing a semiconductor device adopting a structure in which one active area formed on an element substrate is electrically isolated from another active area, that includes a first step in which a first insulating film and a second insulating film, the film quality of which is different from that of the first insulating film, are formed in the area between the one active area and the other active area, a second step in which a groove-like area is formed at the element substrate through a treatment performed on the area between the one active area and the other active area under conditions whereby the etching rate on a surface {100} is higher than the etching rate on a surface {111}, a third step in which the bottom surface of the groove-like area is etched through anisotropic etching, a fourth step in which side etching is performed on the first insulating film and a fifth step in which a corner portion formed at a boundary of the surface {100} and the surface {111} inside the element substrate is rounded off, is provided.

It is to be noted that the first insulating film may be a thermally oxidized film formed through thermal oxidation. In addition, the second step may be implemented under conditions whereby the etching rate on the surface {100} is essentially double or more than double the etching rate on the surface {111}, e.g., within a hydrogen gas atmosphere containing hydrogen chloride gas at a temperature of 800 centigrade or lower. Furthermore, the fifth step may be implemented by performing a heat treatment within a high purity hydrogen gas atmosphere or within a hydrogen gas atmosphere containing hydrogen chloride gas.

By adopting this manufacturing method, the corner portion at the boundary of the side wall and the surface {111} at the element substrate is further rounded off to further reduce the degree to which stress concentrates.

In addition, in a fifth aspect of the present invention, a method for manufacturing a semiconductor device adopting a structure m which one active area formed on an element substrate is electrically isolated from another active area, that includes a first step in which a first insulating film and a second insulating film, the film quality of which is different from that of the first insulating film, are formed in the area between the one active area and the other active area, a second step in which a groove-like area is formed in the area between the one active area and the other active area through anisotropic etching, a third step in which side etching is performed on the first insulating film and a fourth step in which a corner portion formed at the boundary of a surface {100} and a surface {111} is rounded off, is provided.

It is to be noted that the first insulating film may be a thermally oxidized film formed through thermal oxidation, and the fourth step may be implemented by performing a heat treatment within a high purity hydrogen gas atmosphere or within a hydrogen gas atmosphere containing hydrogen chloride gas.

By adopting this manufacturing method, the etching process can be implemented in the simplest, most convenient manner when the corner portion does not have to be rounded off to a great degree, such as when the film thickness of the thermally oxidized film is approximately 300 angstrom or less.

In a sixth aspect of the present invention, a semiconductor device adopting a structure in which one active area formed on an element substrate is electrically isolated from another active area, that is characterized in that a groove-like area is formed between the one active area and the other active area with the side wall of the groove-like area constituted of a surface {111} and the groove-like area covered with an insulating film, is provided.

The semiconductor device described above may be manufactured with ease by adopting the following manufacturing method. Namely, in a seventh aspect of the present invention, a method for manufacturing a semiconductor device adopting a structure in which one active area formed on an element substrate is electrically isolated from another active area, that includes a first step in which a first insulating film and a second insulating film, the film quality of which is different from that of the first insulating film, are formed in the area between the one active area and the other active area, a second step in which a groove-like area is formed at the element substrate through a treatment performed on the area between the one active area and the other active area under conditions whereby the etching rate on a surface {100} is higher than the etching rate on a surface {111}, and a third step in which the groove-like area is thermally oxidized is provided.

It is to be noted that the second step may be implemented under conditions whereby the etching rate on the surface {100} is essentially double or more than double the etching rate on the surface {111}, e.g., within a hydrogen gas atmosphere containing hydrogen chloride gas at a temperature of 800 centigrade or lower.

By adopting this manufacturing method, the shape in the vicinity of the bird's beak is greatly improved and, in addition, a thick field oxide film that will further reduce the wiring capacity and the like can be formed with a greater degree of effectiveness.

In an eighth aspect of the present invention, a method for manufacturing a semiconductor device adopting a structure in which one active area formed on an element substrate is electrically isolated from another active area, that includes a first step in which a first insulating film and a second insulating film, the film quality of which is different from that of the first insulating film, are formed in the area between the one active area and the other active area, a second step in which a groove-like area is formed at the element substrate through a treatment performed on the area between the one active area and the other active area under conditions whereby the etching rate on a surface {100} is higher than the etching rate on a surface {111}, and a third step in which the groove-like area is filled with a third insulating film, is provided.

It is to be noted that the second step may be implemented under conditions whereby the etching rate on the surface {100} is essentially double or more than double the etching rate on the surface {111}, e.g., within a hydrogen gas atmosphere containing hydrogen chloride gas at a temperature of 800 centigrade or lower.

By adopting this manufacturing method, in which a thick thermally oxidized film is not formed, advantages are achieved in that there is no conversion difference which would otherwise result from the presence of a thick thermally oxidized film and that stress is greatly reduced. For this reason, it is a particularly effective manufacturing method to be adopted when forming an active element in the vicinity.

It is to be noted that in this specification and the attached drawings, the "surface {100}" collectively refers to the same type of crystal surfaces having different directionality, e.g., a surface (001), a surface (010) and the like.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

PREFERRED EMBODIMENTS OF THE INVENTION

The following is a detailed explanation of the preferred embodiments of the semiconductor device and the manufacturing method thereof according to the present invention. It is to be noted that in the specification and the attached drawings, the same reference numbers are assigned to components having essentially the same functions and structural features to preclude the necessity for repeated explanation thereof.

(First Embodiment)

The method for manufacturing a semiconductor device in the first embodiment is explained in reference to FIG. 1.

Figure 1A:
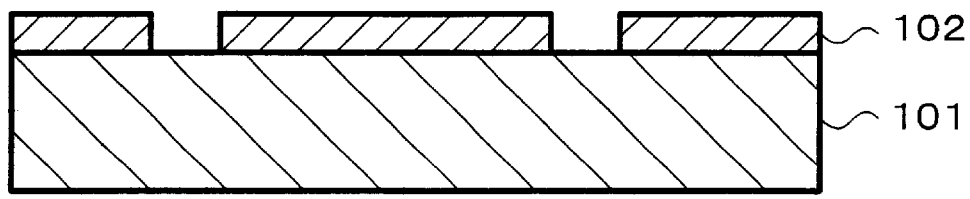
FIG. 1A–1F illustrates the process for manufacturing a semiconductor device in a first embodiment.

First, the front of a surface {100} of an element substrate 101 constituted of silicon is thermally oxidized to approximately 3000 angstrom to form a thermally oxidized film 102. Then, by employing the normal photolithography technology, a resist pattern is formed and using the resist pattern as a mask, the thermally oxidized film 102 is patterned as illustrated in FIG. 1(A).

Figure 1B:
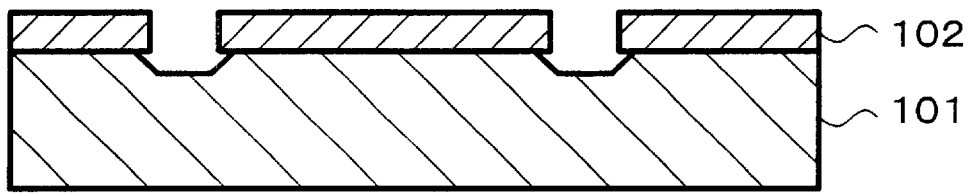

Next, after removing the resist pattern, the front surface of the element substrate 101, which is exposed through the patterned thermally oxidized film 102, is etched to approximately 5000 angstrom within a 20 Torr hydrogen gas atmosphere containing HCl gas at 1% at a temperature of 800 centigrade, as illustrated in FIG. 1(B). It is to be noted that the treatment conditions described above only represent an example, and the present invention is not restricted to this example. For instance, while the treatment temperature only needs to be 850 centigrade or lower, it is more desirable to set it at 800 centigrade or lower. Furthermore, while the content of the HCl gas is set at 1%, to represent a very small ratio in the hydrogen gas atmosphere, in the example above, and the content may be set at any ratio as long as it is 5% or lower, it is particularly desirable to set it at 1% or lower.

Figure 2:
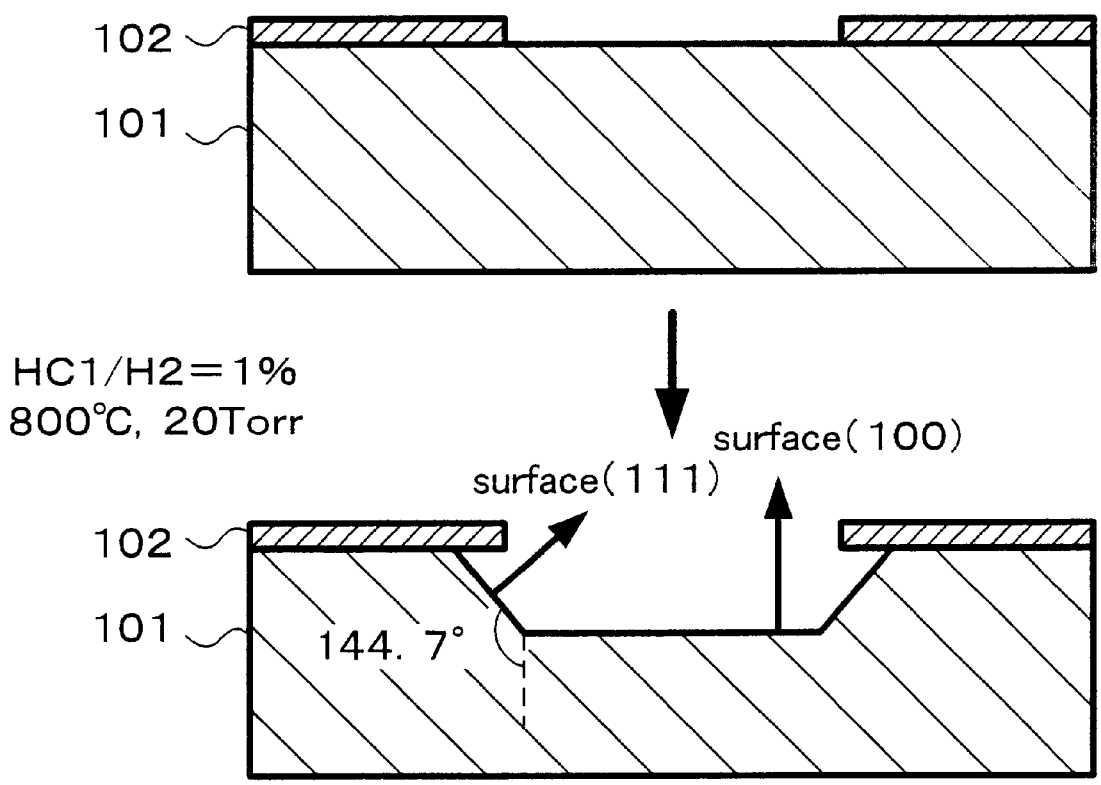
FIG. 2 illustrates the etching shape achieved during the process for manufacturing a semiconductor device illustrated in FIG. 1.

Under the atmospheric conditions described above, there is anisotropy related to the surface orientation when etching the Si and, as illustrated in FIG. 2, the etching rate on the surface {100} is double or more than double the etching rate on the surface {111}. Thus, the surface {111}, the etching rate on which is lower, becomes exposed.

Figure 1C:
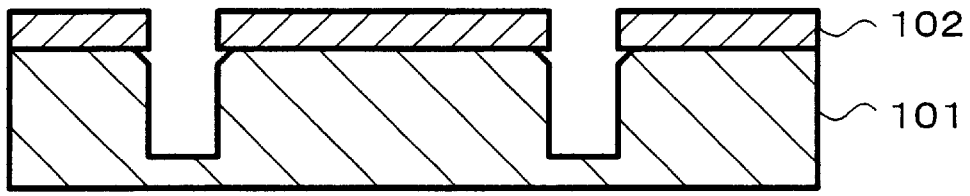

Next, an opening portion is anisotropically etched by using the thermally oxidized film 102 as a mask to form a trench structure, as illustrated in FIG. 1(C).

Figure 1D:
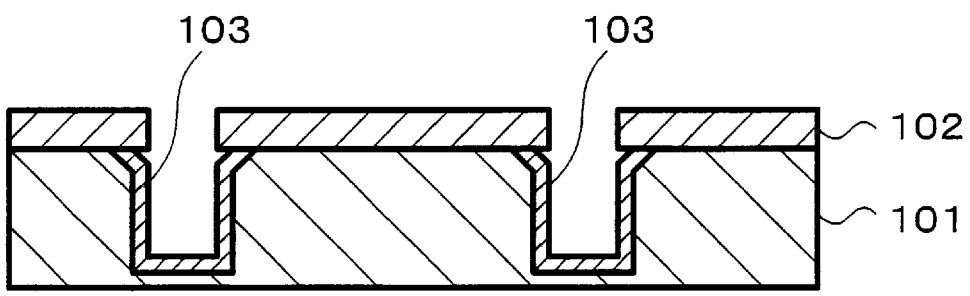

Then, the front surface of the trench is thermally oxidized to approximately 500 angstrom to form an oxide film 103, as illustrated in FIG. 1(D).

Figure 1E:
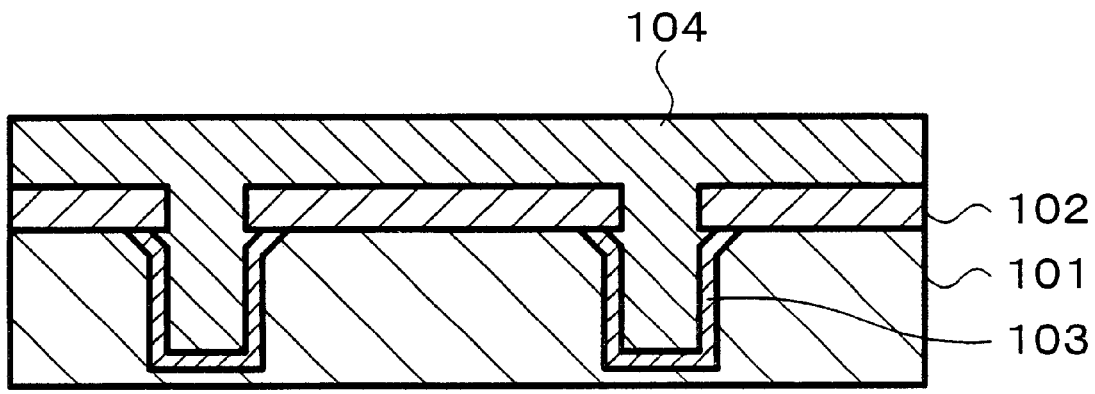

Next, a film 104 achieving outstanding coverage, such as an LPCVD film, is deposited over the entire surface of the substrate to completely fill the trench, as illustrated in FIG. 1(E).

Figure 1F:
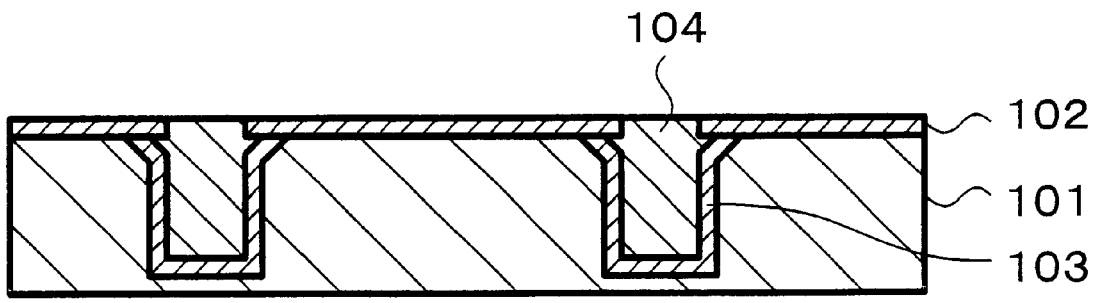

Then, if it is necessary to achieve global planarization due to varying gap intervals, as in the case when STI is adopted, planarization is implemented through CMP. If, on the other hand, there are only narrow constant gap intervals present, the oxide film is etched back through dry etching of the oxide film and the trench is filled with the oxide film as illustrated in FIG. 1(F), to complete the isolation process.

By adopting the method for manufacturing a semiconductor device in this embodiment, the shape of the edge at the upper end of the trench is widened to approximately 144.7 degrees as illustrated in FIG. 2, to greatly reduce the concentration of corner stress resulting from the thermal oxidation. As a result, the leak current is reduced and crystal defects are prevented to result in a great improvement in yield.

(Second Embodiment)

The method for manufacturing a semiconductor device in the second embodiment is explained in reference to FIG. 3. This embodiment is characterized in that the treatment is implemented over two steps performed at different atmosphere temperatures.

Figure 3A:
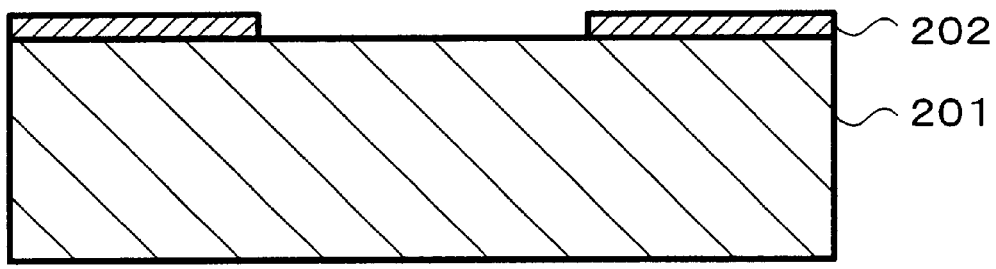
FIG. 3A–3C illustrates the process for manufacturing a semiconductor device in a second embodiment.

First, the front of a surface {100} of an element substrate 201 constituted of silicon is thermally oxidized to approximately 3000 angstrom to form a thermally oxidized film 202. Then, by employing the normal photolithography technology, a resist pattern is formed and using the resist pattern as a mask, the thermally oxidized film 202 is patterned, as illustrated in FIG. 3(A).

Figure 3B:
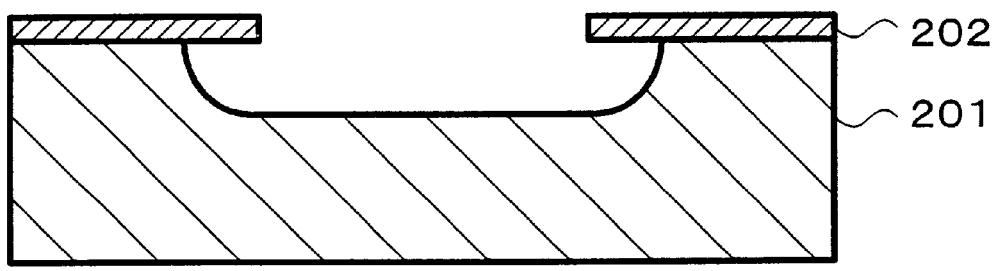
Figure 4:
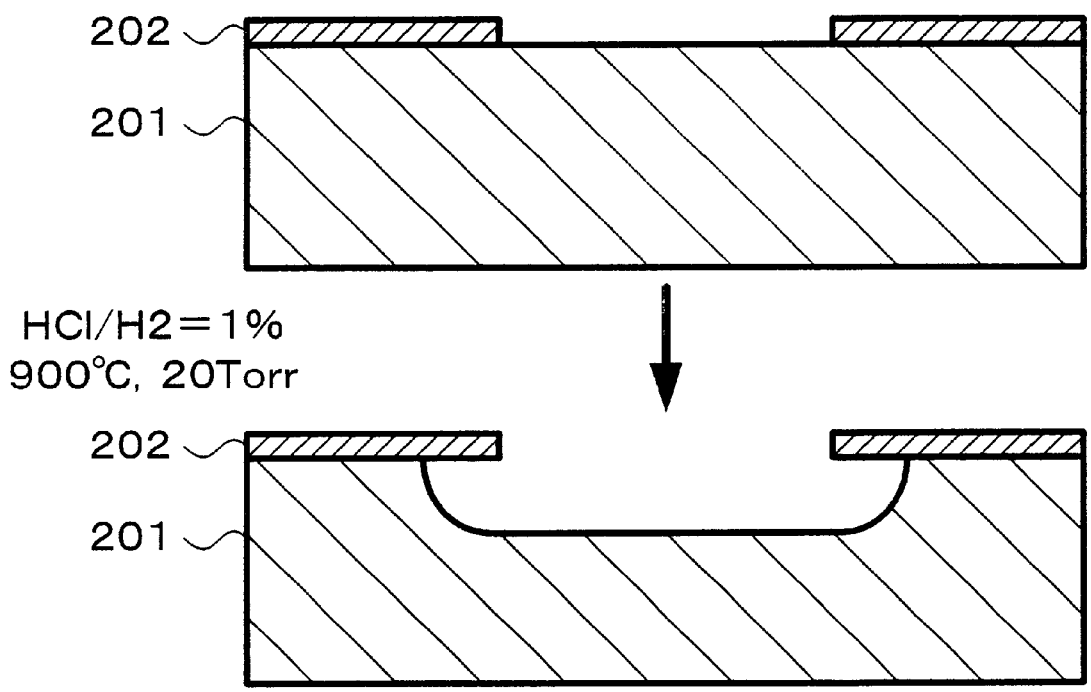
FIG. 4 illustrates the etching shape achieved during the process for manufacturing a semiconductor device illustrated in FIG. 2.

Then, after removing the resist pattern, a first step and a second step described below are implemented. First, in the first step, a treatment is performed within a 20 Torr hydrogen gas atmosphere containing HCl gas at 1% at a temperature of 900 centigrade. During the first step, the anisotropy of the silicon etching rate at the crystal surface is extremely low and etching is essentially implemented isotropically, as illustrated in FIGS. 3(B) and 4. It is to be noted that the treatment conditions above only represent an example, and the present invention is not restricted to this example. For instance, while the treatment temperature only needs to be 850 centigrade or higher, it is more desirable to set it at 900 centigrade or higher. Furthermore, while the content of the HCl gas is set at 1%, to represent a very small ratio in the hydrogen gas atmosphere, in the example above, and the content may be set at any ratio as long as it is 5% or lower, it is particularly desirable to set it at 1% or lower.

Figure 3C:
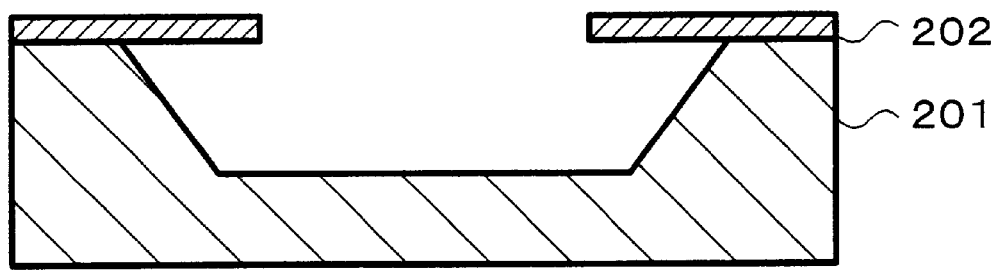

In the second step that follows, the treatment is performed within an atmosphere achieved by lowering the temperature to 800 centigrade. As illustrated in FIGS. 3(C) and 2, the anisotropy of the silicon etching rate at the crystal surface becomes more pronounced during the second step. It is to be noted that while the treatment temperature is only required to be 850 centigrade or lower, it is particularly desirable to set it at 800 centigrade or lower.

The subsequent process is essentially identical to that in the first embodiment illustrated in FIGS. 1(C)~1(F). First, an opening portion is anisotropically etched by using the thermally oxidized film 202 as a mask to form a trench structure. Then, the front surface of the trench is thermally oxidized to form an oxide film and a film achieving outstanding coverage such as an LPCVD film is deposited over the entire surface of the substrate to completely embed the trench. Finally, the isolation process is completed after planarization.

By adopting the method for manufacturing a semiconductor device in this embodiment, side etching can be performed with a great degree of efficiency under the mask pattern. Namely, while the side etching quantity becomes reduced under more highly anisotropic conditions, a certain degree of side etching is required in order to achieve an improvement in the shape of the corner portion in consideration of the conversion difference at the time of trench etching. Because of this, etching is first performed under isotropic etching conditions through which side etching is achieved with a high degree of efficiency. Then, by performing a treatment under highly anisotropic conditions, the degree of freedom for controlling the depthwise direction and the side etching quantity is increased. A further advantage is achieved in that by performing the treatment at high temperature, the length of the treatment time can be reduced.

(Third Embodiment)

The method for manufacturing a semiconductor device in the third embodiment is now explained in reference to FIG. 5. This embodiment is characterized in that a three-layer film constituted of a thermally oxidized film, a CVD nitride film and a CVD oxide film is employed to constitute a masking insulating film for trench formation, instead of the single layer oxide film employed in the first and second embodiments.

First, a thermally oxidized film 302 is formed by thermally oxidizing the front of a surface {100} of an element substrate 301 constituted of silicon over approximately 3000 angstrom. Then, a CVD nitride film 303 and a CVD oxide film 304 are sequentially deposited over the entire surface of the thermally oxidized film 302 to achieve a three-layer film structure. Next, through the regular photolithography technology, a resist pattern is formed and the three-layer film is patterned using the resist pattern as a mask.

Figure 5A:
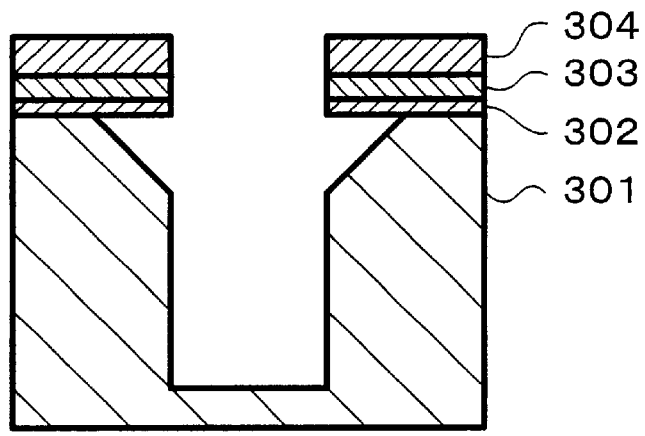
FIG. 5A–5C illustrates the process for manufacturing a semiconductor device in a third embodiment.

Then, after removing the resist pattern, through a process similar to that employed in the first embodiment or the second embodiment, a trench with the shape of the corner portion 301a at the upper end of the trench widening at approximately 144.7 degrees is formed, as illustrated in FIG. 5(A).

Figure 5B:
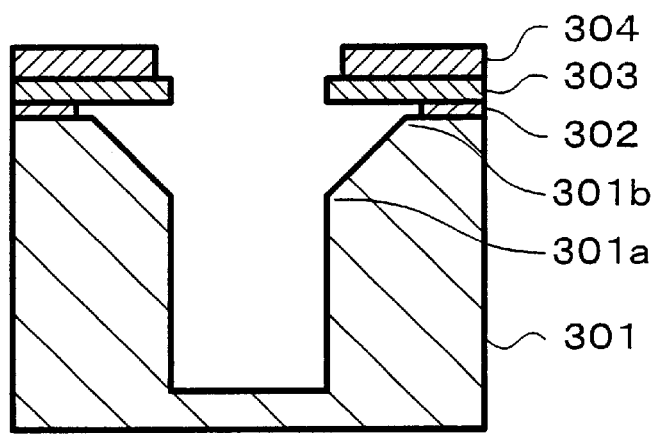

Next, side etching is performed on the thermally oxidized film 302. The side etching of the thermally oxidized film 302 is performed to expose the corner portion 301b of the element substrate 301 and to round in the corner through the step described below. The side etching is performed over a distance which is approximately twice the thickness of the thermally oxidized film 302, and it is implemented as illustrated in FIG. 5(B) by dipping in hydrofluoric acid.

Figure 5C:
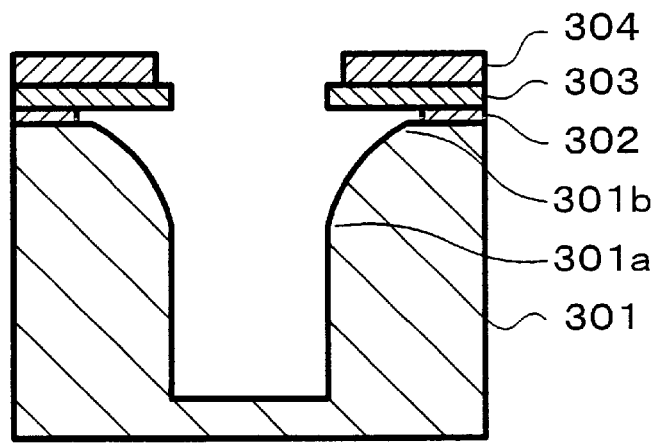

Then, through a treatment performed within a 40 Torr high purity hydrogen gas atmosphere at a temperature of 1000 centigrade for approximately 3 minutes or within a 20 Torr hydrogen gas atmosphere containing a HCl gas at 1% at a temperature of 900 centigrade, the corner portions 301a and 301b are rounded off as illustrated in FIG. 5(C). It is to be noted that the treatment conditions described above only represent an example, and the present invention is not restricted to this example. For instance, the treatment temperature of 1000 centigrade above only indicates that it may be set within a range of 1000~1100 centigrade while it is more desirable to set it at 1000 centigrade. In addition, the treatment temperature of 900 centigrade indicates that while it may be set at a temperature of 850 centigrade or higher, it is more desirable to set it at 900 centigrade or higher. Furthermore, while the content of the HCl gas is set at 1%, to represent a very small ratio in the hydrogen gas atmosphere in the example above, and the content may be set at any ratio as long as it is 5% or lower, it is particularly desirable to set it at 1% or lower.

The subsequent process is essentially the same as that performed in the first embodiment illustrated in FIGS. 1(D)~1(F). First, a front surface of the trench is thermally oxidized to form an oxide film, a film achieving outstanding coverage such as an LPCVD film is deposited over the entire surface to completely fill the trench, and finally, the isolation process is completed after planarization.

By adopting the method for manufacturing a semiconductor device in this embodiment, through which the edge area of the element substrate 301 is rounded off, the concentration of stress can be further reduced.
(Fourth Embodiment)

The method for manufacturing a semiconductor device in the fourth embodiment is now explained in reference to FIG. 6.

First, a thermally oxidized film 402 is formed by thermally oxidizing the front of a surface {100} of an element substrate 401 constituted of silicon over approximately 3000 angstrom Then, a CVD nitride film 403 and a CVD oxide film 404 are sequentially deposited over the entire surface of the thermally oxidized film 402 to achieve a three-layer film structure. Next, through the regular photolithography technology, a resist pattern is formed and the three-layer film is patterned using the resist pattern as a mask.

Figure 6A:
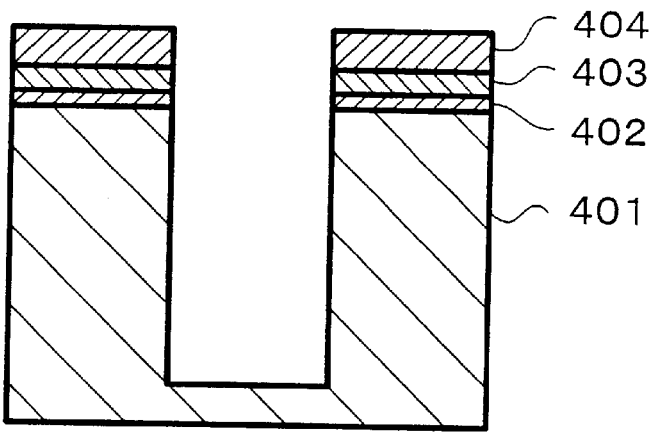
FIG. 6A–6C illustrates the process for manufacturing a semiconductor device in a fourth embodiment.

Then, after removing the resist pattern, an opening portion is anisotropically etched by using the three-layer film as a mask to form a trench, as illustrated in FIG. 6(A).

Figure 6B:
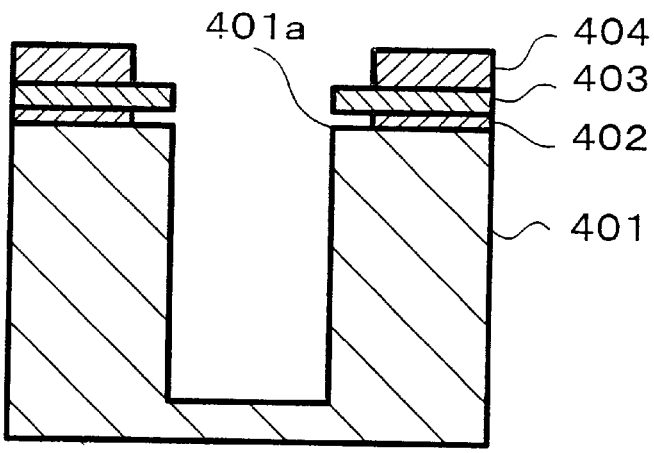

Next, side etching is performing on the thermally oxidized film 402. The side etching of the thermally oxidized film 402 is performed to expose the corner portion 401a of the element substrate 401 and to round in the corner through the step described below. The side etching is performed over approximately 1000 angstrom by dipping it in hydrofluoric acid, as illustrated in FIG. 6(B).

Figure 6C:
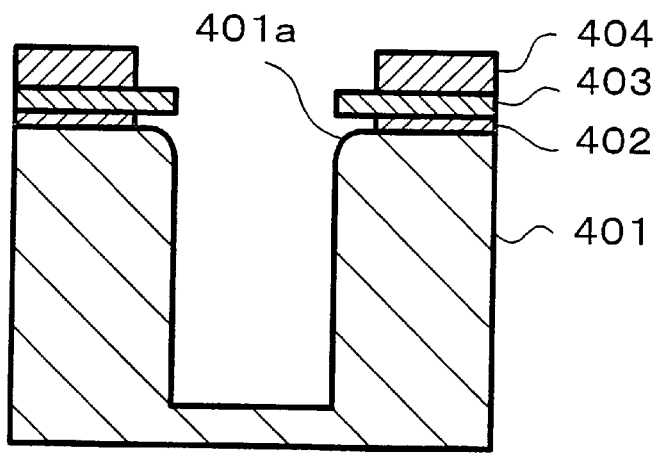

Then, through a treatment performed within a 40 Torr high purity hydrogen gas atmosphere at a temperature of 1000 centigrade for approximately 3 minutes or within a 20 Torr hydrogen gas atmosphere containing a HCl gas at 1% at a temperature of 900 centigrade the corner portion 401a is rounded off, as illustrated in FIG. 6(C). It is to be noted that the treatment conditions described above only represent an example and the present invention is not restricted to this example. For instance, the treatment temperature of 1000 centigrade above only indicates that it may be set within a range of 1000~1100 centigrade while it is more desirable to set it at 1000 centigrade. In addition, the treatment temperature of 900 centigrade indicates that while it may be set at a temperature of 850 centigrade or higher, it is more desirable to set it at 900 centigrade or higher. Furthermore, while the content of the HCl gas is set at 1%, to represent a very small ratio in the hydrogen gas atmosphere, in the example above, and the content may be set at any ratio as long as it is 5% or lower, it is particularly desirable to set it at 1% or lower.

The subsequent process is essentially the same as that performed in the first embodiment illustrated in FIGS. 1(D)~1(F). First, the front surface of the trench is thermally oxidized to form an oxide film, a film achieving outstanding coverage such as an LPCVD film is deposited over the entire surface to completely fill the trench, and finally, the isolation process is completed after planarization.

While the method for manufacturing a semiconductor device in this embodiment facilitates the etching process using HCl/H$_2$ most effectively, the corner portion is rounded off only slightly. Thus, it is an effective method to be adopted when the thermally oxidized film formed at the trench surface has a thickness of approximately 300 angstrom or less.

(Fifth Embodiment)

The method for manufacturing a semiconductor device in the fifth embodiment is explained in reference to FIG. 7. This embodiment may be adopted when forming a LOCOS isolation structure instead of a trench isolation structure.

Figure 7A:
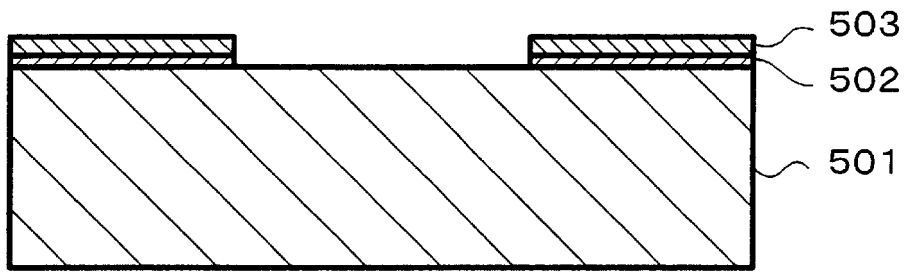
FIG. 7A–7D illustrates the process for manufacturing a semiconductor device in a fifth embodiment.

First, the front of a surface {100} of an element substrate 501 constituted of silicon is thermally oxidized to approximately 100 angstrom to form a thermally oxidized film 502. Next, a CVD nitride film 503 is deposited to a thickness of approximately 1000 angstrom. Then, by employing regular photolithography technology, a resist pattern is formed and using the resist pattern as a mask, the CVD nitride film 503 and the thermally oxidized film 502 are patterned as illustrated in FIG. 7(A).

Figure 7B:
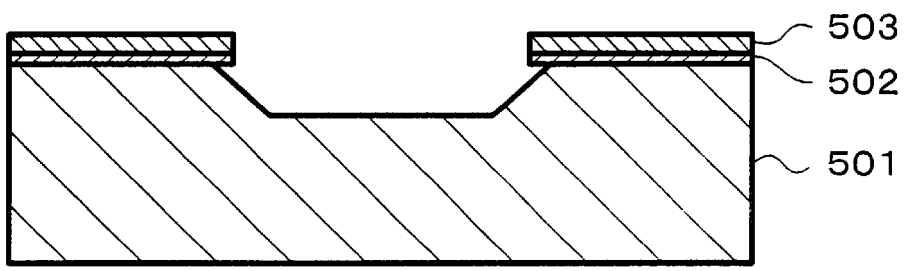

Then, after removing the resist pattern, the surface {100} is etched to approximately 5000 angstrom through a treatment performed within a 20 Torr hydrogen gas atmosphere containing HCl gas at 1% at a temperature of 800 centigrade for approximately 20 minutes, as illustrated in FIG. 7(B). Due to the anisotropy of the etching rate relative to the crystal surface, a surface {111} is obtained at the side wall. It is to be noted that the treatment conditions described above only represent an example, and the present invention is not restricted to this example. For instance, while the treatment temperature only needs to be 850 centigrade or lower, it is more desirable to set it at 800 centigrade or lower. Furthermore, while the content of the HCl gas is set at 1%, to represent a very small ratio in the hydrogen gas atmosphere, in the example above, and the content may be set at any ratio as long as it is 5% or lower, it is particularly desirable to set it at 1% or lower.

Figure 7C:
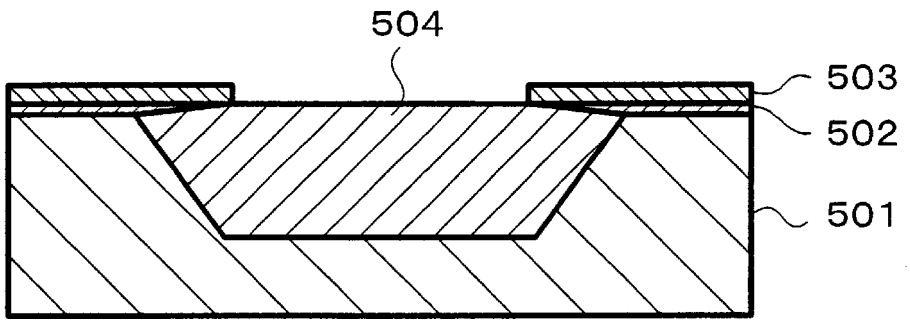
Figure 7D:
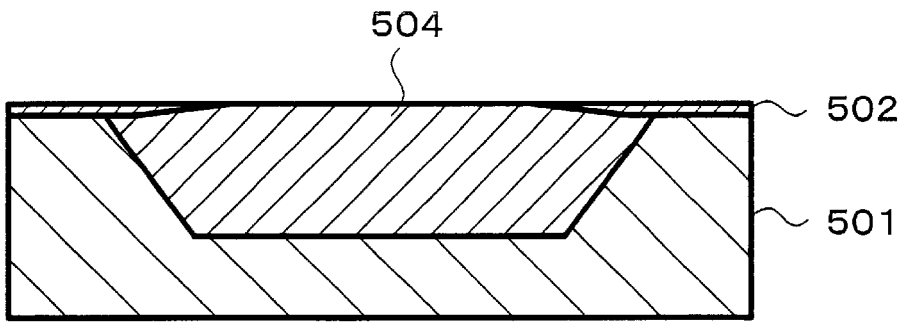

Then, by performing thermal oxidation over the entire surface, a thermally oxidized film 504 having a film thickness of approximately 10000 angstrom is formed, as illustrated in FIG. 7(C). Finally, by removing the CVD nitride film 503 at the surface using hot phosphoric acid, the LOCOS isolation process is completed, as illustrated in FIG. 7(D).

Under normal circumstances, it is necessary to etch the silicon substrate in advance in order to reduce the level differences manifesting after the LOCOS isolation process. While an anisotropic dry etching method or an isotropic wet etching method is adopted (recessed LOCOS) normally, these methods tend to complicate the shape of the so-called bird's beak at the LOCOS end forming minute level differences, which may, in turn, result in problems occurring in subsequent steps. By adopting the method for manufacturing a semiconductor device in this embodiment, the shape in the vicinity of the bird's beak is greatly improved, and an added advantage is achieved in that a thick field oxide film which will further reduce the wiring capacity and the like can be formed with ease.

(Sixth Embodiment)

The method for manufacturing a semiconductor device in the sixth embodiment is explained in reference to FIG. 8. As in the fifth embodiment, this embodiment, too, may be adopted when forming a LOCOS isolation structure instead of a trench isolation structure.

Figure 8A:
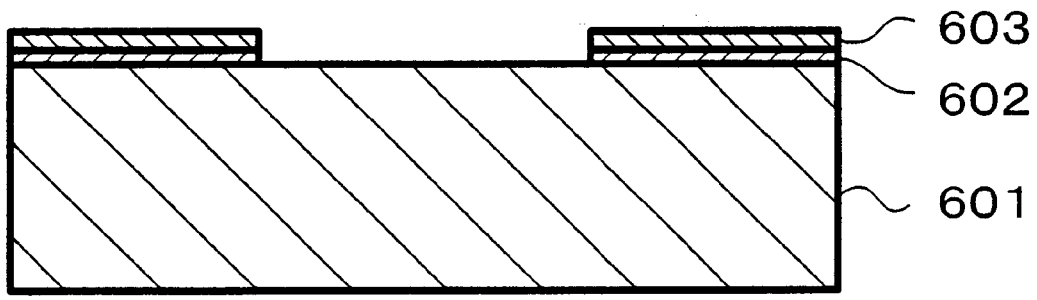
FIG. 8A–8E illustrates the process for manufacturing a semiconductor device in a sixth embodiment.

First, the front of a surface {100} of an element substrate 601 constituted of silicon is thermally oxidized to approximately 100 angstrom to form a thermally oxidized film 602. Next, a CVD nitride film 603 is deposited to a thickness of approximately 1000 angstrom. Then, by employing regular photolithography technology, a resist pattern is formed and using the resist pattern as a mask, the CVD nitride film 603 and the thermally oxidized film 602 are patterned as illustrated in FIG. 8(A).

Figure 8B:
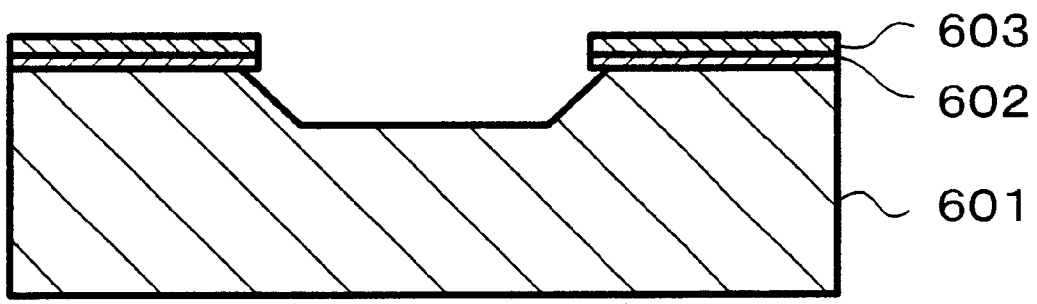

Then, after removing the resist pattern, the surface {100} is etched to approximately 5000 angstrom through a treatment performed within a 20 Torr hydrogen gas atmosphere containing HCl gas at 1% at a temperature of 800 centigrade for approximately 20 minutes, as illustrated in FIG. 8(B). Due to the anisotropy of the etching rate relative to the crystal surface, a surface {111} is obtained at the side wall. It is to be noted that the treatment conditions described above only represent an example, and the present invention is not restricted to this example. For instance, while the treatment temperature only needs to be 850 centigrade or lower, it is more desirable to set it at 800 centigrade or lower. Furthermore, while the content of the HCl gas is set at 1%, to represent a very small ratio in the hydrogen gas atmosphere in the example above, and the content may be set at any ratio as long as it is 5% or lower, it is particularly desirable to set it at 1% or lower.

Figure 8C:
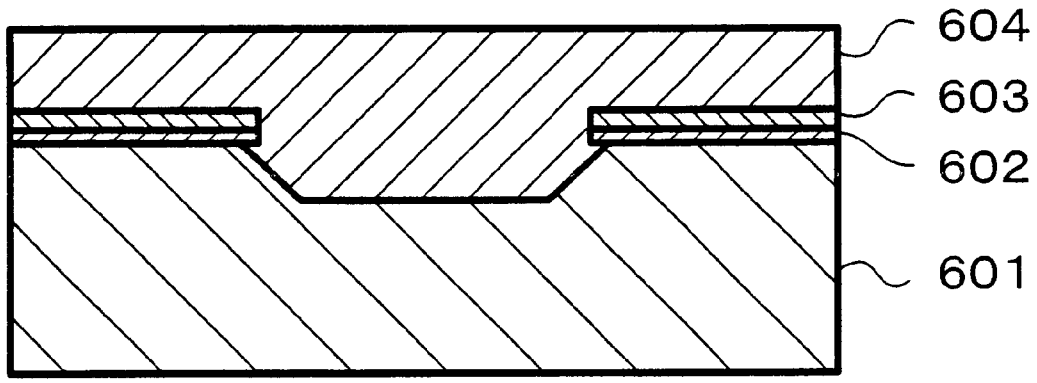

Then, by depositing a film 604 which achieves outstanding coverage such as an LPCVD film over the entire surface of the substrate, filing is achieved as illustrated in FIG. 8(C).

Figure 8D:
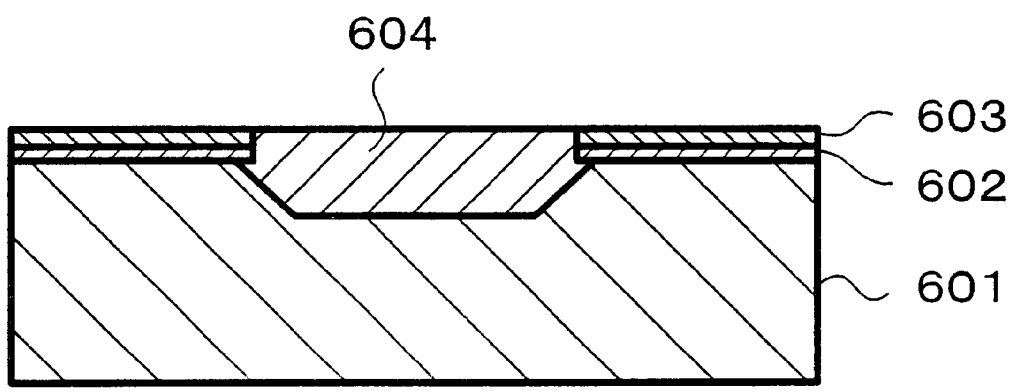

Next, as illustrated in FIG. 8(D), planarization is performed through CMP if varying gap intervals are present to necessitate global planarization as in the case in which STI is adopted, or if there are only narrow constant gap intervals, the oxide film is etched back through dry etching of the oxide film.

Figure 8E:
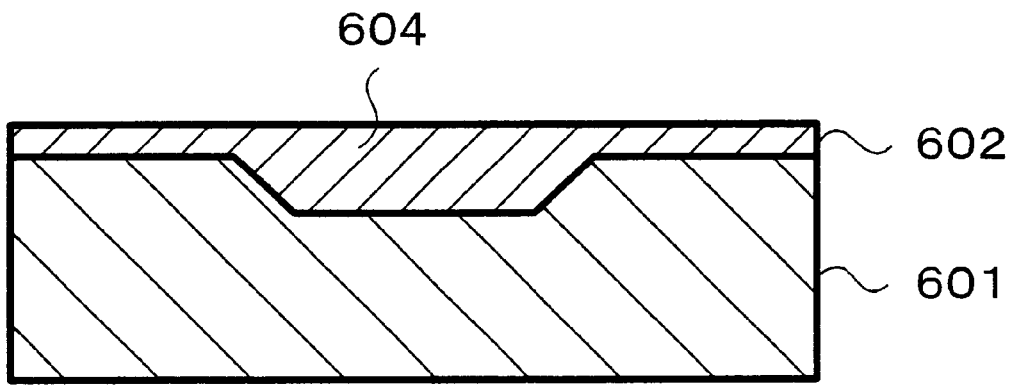
Figure 9A:
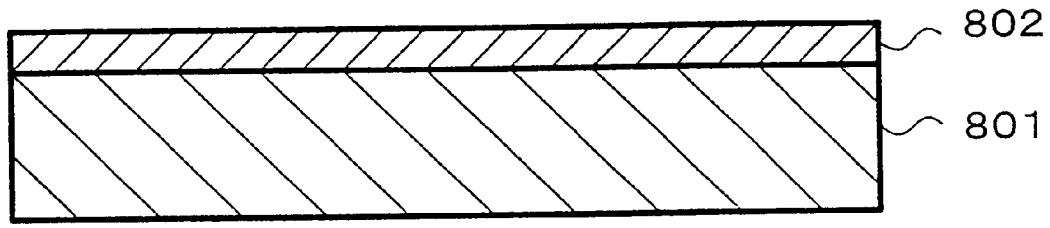
FIG. 9A–9F illustrates a process for manufacturing a semiconductor device in the prior art.
Figure 9B:
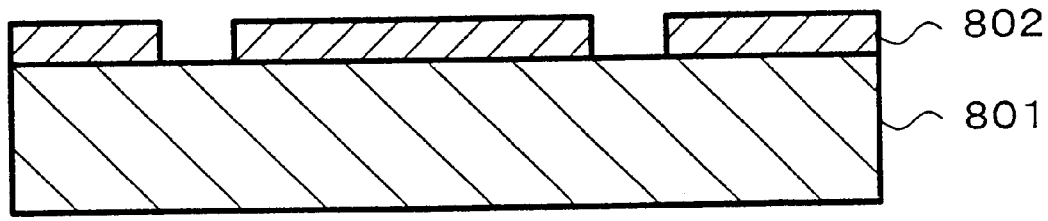
Figure 9C:
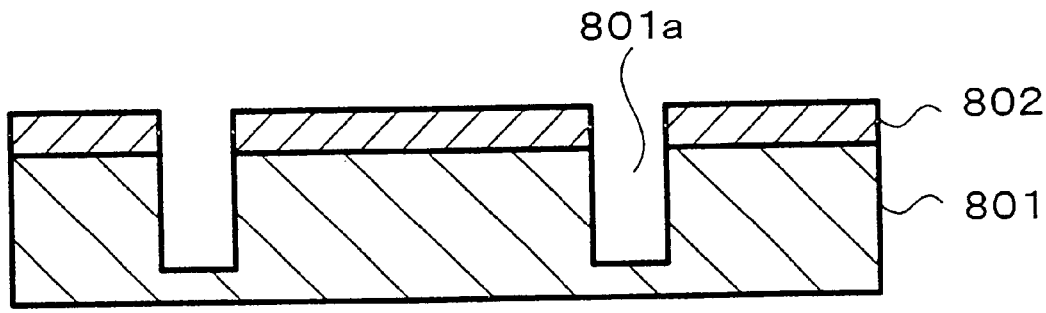
Figure 9D:
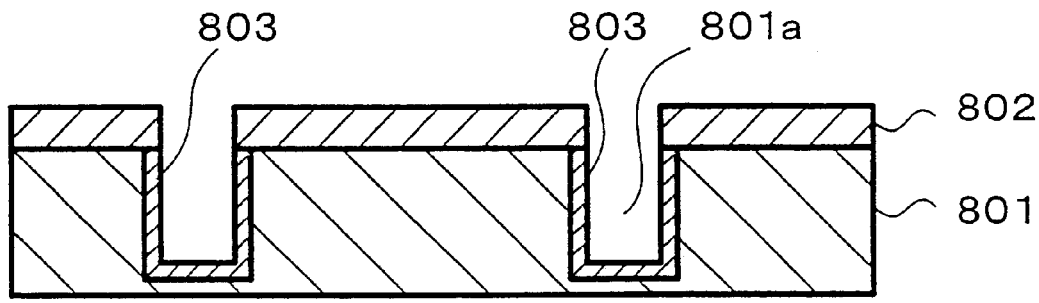
Figure 9E:
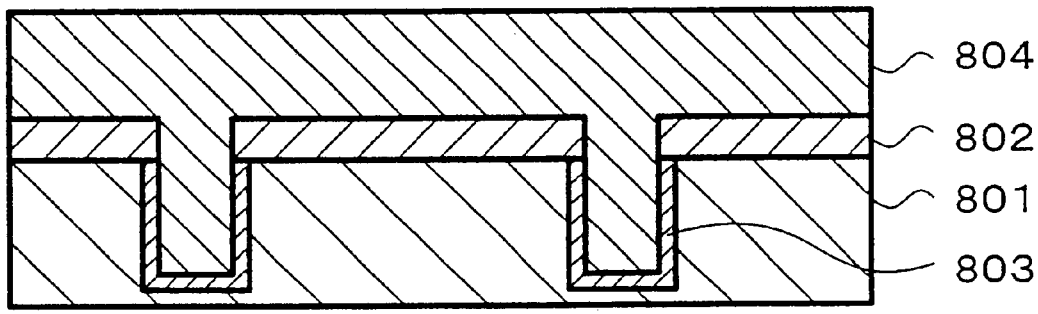
Figure 9F:
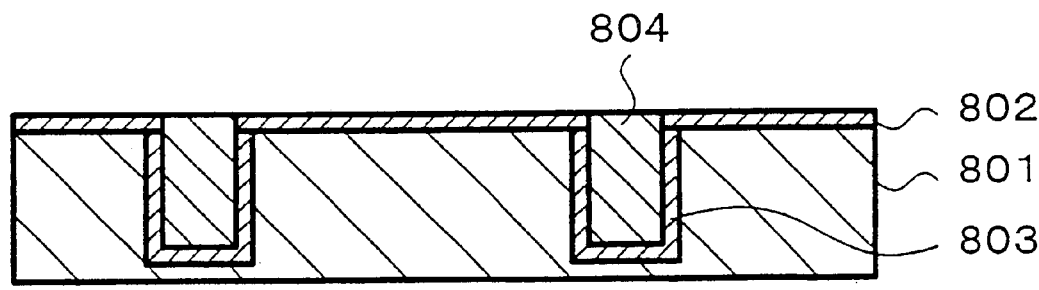
Figure 10:
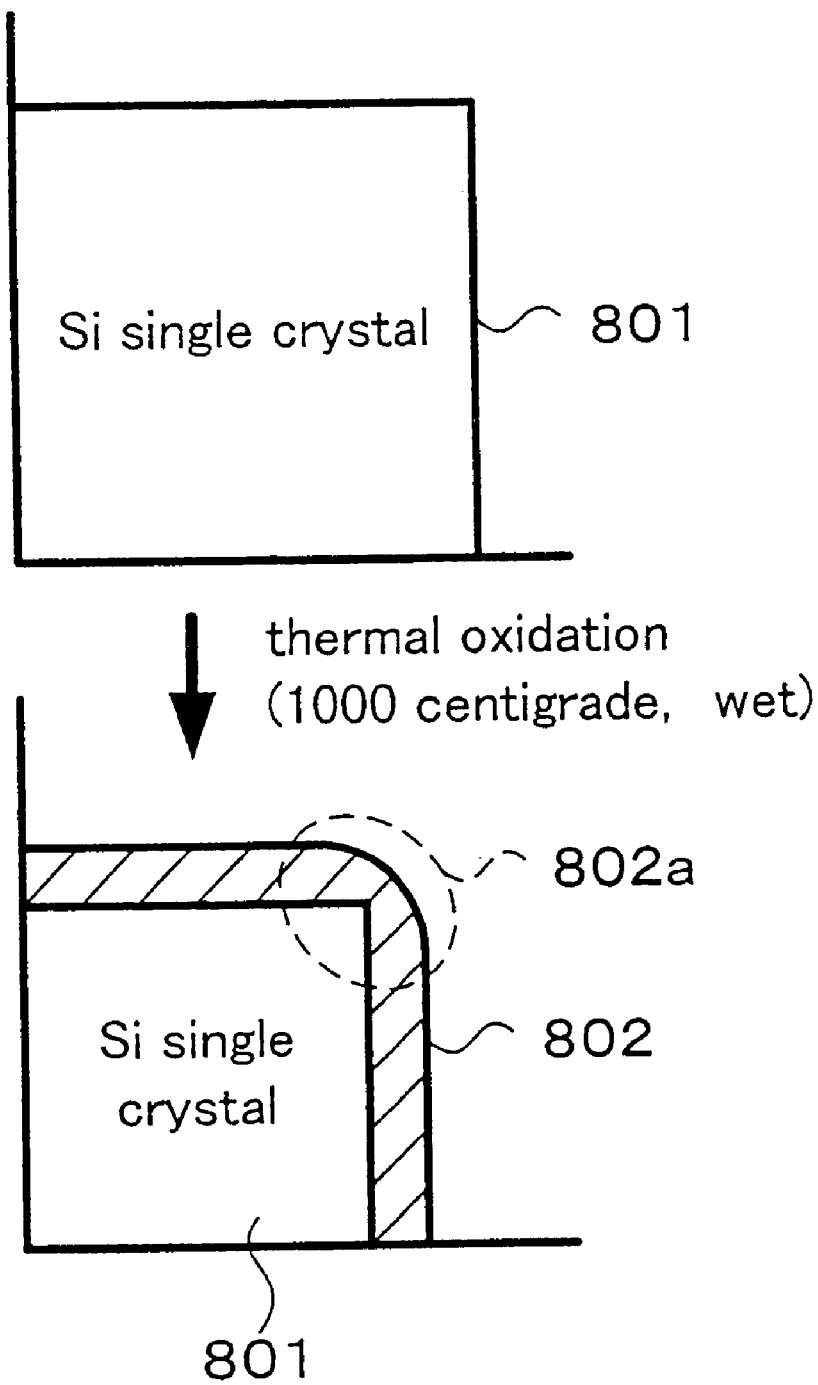
FIG. 10 illustrates the shape of the thermally oxidized film achieved during the process for manufacturing a semiconductor device illustrated in FIG. 9.

Finally, by removing the CVD nitride film 603 that has remained at the surface by using hot phosphoric acid, the LOCOS isolation process is completed as illustrated in FIG. 8(E).

By adopting the method for manufacturing a semiconductor device in this embodiment, advantages similar to those achieved in the fifth embodiment are achieved, and furthermore, since it is not necessary to form a thick thermally oxidized film through thermal oxidation, any conversion difference attributable to the presence of a thick thermally oxidized film can be eliminated, to greatly reduce stress. Thus, it is a method that may be effectively employed when forming an active element in the vicinity.

While the invention has been particularly shown and described with respect to preferred embodiments of the semiconductor and the manufacturing method thereof by referring to the attached drawings, the present invention is not limited to these examples and it will be understood by those skied in the art that various changes in form and detail may be made therein without departing from the spirit, scope and teaching of the invention.

For instance, while the angle at the edge is set at approximately 144.7 degrees by forming the shape of the trench with the side wall and the surface {111} in the embodiments of the present invention described earlier, the present invention is not restricted to this example. The concentration of stress can be reduced by forming the edge portion to have any angle that is larger than 90 degrees.

In addition, the etching conditions such as the gas mix ratios, the temperatures and the pressures adopted in the embodiment of the present invention only represent examples and the present invention will achieve similar advantages by adopting any other etching conditions that will achieve a similar shape.

The semiconductor device and the manufacturing method thereof according to the present invention achieve the following outstanding advantages.

With the semiconductor device in the first aspect of the present invention in which the shape of the right angle edge portion at the upper end of the trench is widened to an angle of 90 degrees or more, the concentration of corner stress resulting from thermal oxidation is greatly reduced. As a result, a great improvement in yield can be expected through a reduced leak current and prevention of crystal defects. It is to be noted that the structure described above can be easily achieved by adopting, for instance, the method for manufacturing a semiconductor device in the second aspect of the present invention.

In the method for manufacturing a semiconductor device in the third aspect of the present invention, side etching can be performed with a high degree of efficiency under the mask pattern. Namely, while the side etching quantity becomes reduced under more highly anisotropic conditions, a certain degree of side etching is required to achieve an improvement in the shape of the corner portion in consideration of the conversion difference occurring during the trench etching. Thus, isotropic etching conditions are adopted to achieve side etching in an efficient manner for this purpose, and then a treatment is performed under highly anisotropic conditions to increase the degree of freedom for controlling the depthwise direction and the side etching quantity and to reduce the length of time required for the treatment.

By adopting the method for manufacturing a semiconductor device in the fourth aspect of the present invention through which the edge area is further rounded off even though only slightly, the concentration of stress can be further reduced.

While the method for manufacturing a semiconductor device in the fifth aspect of the present invention facilitates the etching process using $HCl/H_2$ most effectively, the corner portion is rounded off only to a very slight degree. Thus, it is a method that will be effectively employed when the thermally oxidized film has a film thickness of 300 angstrom or less.

In the semiconductor device in the sixth aspect of the present invention, the shape in the vicinity of the bird's beak is greatly improved and furthermore, a thick field oxide film through which the wiring capacity and the like can be further reduced can be formed in an effective manner. It is to be noted that this structure can be easily achieved by adopting, for instance, the method for manufacturing a semiconductor device in the seventh aspect of the present invention.

Through the method for manufacturing a semiconductor device in the eighth aspect of the present invention, since a thick thermally oxidized film is not formed, no conversion difference attributable to the presence of such a thick thermal oxidized film will manifest, to greatly reduce stress. For this reason, it is a method that will be effective when forming an active element in the vicinity.

The entire disclosure of Japanese Patent Application No. 10-334021 filed on Nov. 25, 1998 including specification, claims, drawings and summary is incorporated herein by reference in its entirety.

What is claimed is:

1. A method for manufacturing a semiconductor device having one active area and another active area, and a further active area formed on an element substrate that are electrically isolated from each other, comprising:

forming a groove-like area at said element substrate by performing a treatment under conditions wherein an etching rate on a first surface is essentially equal to an etching rate on a second surface in an area between said one active area said another active area and said further active area, said forming being implemented within a hydrogen gas atmosphere containing hydrogen chloride gas at a temperature of 900 degrees centigrade or higher;

etching said groove-like area under conditions wherein said etching rate at said first surface is higher than said etching rate on said second surface; and etching a bottom surface of said groove-like area through anisotropic etching.

2. The method for manufacturing a semiconductor device according to claim 1, wherein:

said etching said groove-like area is implemented under conditions wherein said etching rate on said first surface is essentially double or more than double said etching rate on said second surface.

3. A method for manufacturing a semiconductor device having one active area and another active area, and a further active area formed on an element substrate that are electrically isolated from each other, comprising:

forming a groove-like area at said element substrate by performing a treatment under conditions wherein an etching rate on a first surface is essentially equal to an etching rate on a second surface in an area between said one active area, said another active area and said further active area;

etching at said groove-like area under conditions wherein said etching rate at said first surface is essentially double or more than double said etching rate on said second surface, and implemented within a hydrogen gas atmosphere containing hydrogen chloride gas at a temperature of 800 degrees centigrade or lower; and etching a bottom surface of said groove-like area through anisotropic etching.

4. The method for manufacturing a semiconductor device according to claim 1, wherein the hydrogen gas atmosphere during said forming is maintained at 20 Torr.

5. The method for manufacturing a semiconductor device according to claim 1, wherein a percentage of the hydrogen gas in the atmosphere during said forming is 5% or lower.

6. The method for manufacturing a semiconductor device according to claim 5, wherein the percentage of the hydrogen gas in the atmosphere during said forming is 1%.

7. The method for manufacturing a semiconductor device according to claim 1, wherein said etching of said groove-like area is implemented within a hydrogen gas atmosphere containing hydrogen chloride gas at a temperature of 850 degrees centigrade or lower.

8. The method for manufacturing a semiconductor device according to claim 7, wherein the temperature during said etching of said groove-like area is 800 degrees centigrade or lower.

9. The method for manufacturing a semiconductor device according to claim 8, wherein the temperature during said etching of said groove-like area is 800 degrees centigrade.

10. A method of forming a device isolation area in a semiconductor device, comprising:

etching a substrate to form a groove-like area in the substrate, under conditions whereby an etching rate of sidewalls of the groove-like area is substantially equal to an etching rate of a bottom surface of the groove-like area;

etching the groove-like area to further define the groove-like area, under conditions whereby an etching rate of the bottom surface of the groove-like area is essentially double or more an etching rate of the sidewalls of the groove-like area, said etching the groove-like area being performed after completion of said etching a substrate; and etching the further defined groove-like area to complete formation of the device isolation area, under conditions whereby the further defined groove-like area is anisotropically etched.

11. The method of forming a device isolation area of claim 10, wherein said etching a substrate is performed in a hydrogen gas atmosphere containing hydrogen chloride gas at a temperature of 900 degrees centigrade or higher.

12. The method of forming a device isolation area of claim 11, wherein the hydrogen gas atmosphere is maintained at 20 Torr.

13. The method of forming a device isolation area of claim 11, wherein a content of the hydrogen chloride gas in the hydrogen gas atmosphere is 5% or lower.

14. The method of forming a device isolation area of claim 10, wherein said etching the groove-like area is performed in a hydrogen chloride gas atmosphere containing hydrogen chloride gas at a temperature of 850 degrees centigrade or lower.

15. A method of forming a device isolation area in a semiconductor device, comprising:

etching a substrate to form a groove-like area in the substrate, under conditions whereby an etching rate of sidewalls of the groove-like area is substantially equal to an etching rate of a bottom surface of the groove-like area;

etching the groove-like area to further define the groove-like area, under conditions whereby an etching rate of the bottom surface of the groove-like area is essentially double or more an etching rate of the sidewalls of the groove-like area, said etching the groove-like area being performed after completion of said etching a substrate; and etching the further defined groove-like area to complete formation of the device isolation area, under conditions whereby the further defined groove-like area is anisotropically etched, said etching a substrate is performed in a hydrogen gas atmosphere containing hydrogen chloride gas at a temperature of 900 degrees centigrade or higher, and said etching the groove-like area is performed in a hydrogen gas atmosphere containing hydrogen chloride gas at a temperature of 850 degrees centigrade or lower.

16. The method of forming a device isolation area of claim 15, wherein the hydrogen gas atmosphere is maintained at 20 Torr.

17. The method of forming a device isolation area of claim 15, wherein a content of the hydrogen chloride gas in the hydrogen gas atmosphere is 5% or lower.

* * * * *